US012604405B2

(12) United States Patent
Williams et al.

(10) Patent No.: US 12,604,405 B2
(45) Date of Patent: Apr. 14, 2026

(54) MIRROR-CORE MOUNTING MULTIPLE COMPUTER PROCESSOR MODULES FOR MINIMIZED TRACE LENGTH

(71) Applicant: Intel Corporation, Santa Clara, CA (US)

(72) Inventors: Carl Williams, Manitou Springs, CO (US); Steven Miller, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 875 days.

(21) Appl. No.: 17/703,717

(22) Filed: Mar. 24, 2022

(65) Prior Publication Data

US 2023/0309226 A1     Sep. 28, 2023

(51) Int. Cl.
H05K 1/14          (2006.01)
H05K 7/14          (2006.01)
(52) U.S. Cl.
CPC ........... H05K 1/145 (2013.01); H05K 7/1487 (2013.01); H05K 2201/10545 (2013.01)

(58) Field of Classification Search
CPC ....................................................... H05K 7/00
See application file for complete search history.

(56) References Cited

FOREIGN PATENT DOCUMENTS

CN          113133198 A  *  7/2021  ............. H05K 1/144

* cited by examiner

*Primary Examiner* — Jerry Wu
(74) *Attorney, Agent, or Firm* — Schwabe, Williamson & Wyatt, P.C.

(57)          ABSTRACT

Embodiments disclosed herein include a computer system. In an embodiment, the computer system comprises a printed circuit board assembly (PCBA) with a first surface and a second surface opposite from the first surface. In an embodiment, a first computer processor module is coupled to the first surface of the PCBA, and a second computer processor module is coupled to the second surface of the PCBA. In an embodiment, the first computer processor module is communicatively coupled to the second computer processor module through an electrical path that passes through a thickness of the PCBA.

12 Claims, 11 Drawing Sheets

MIRROR-CORE MOUNTING MULTIPLE COMPUTER PROCESSOR MODULES FOR MINIMIZED TRACE LENGTH

TECHNICAL FIELD

Embodiments of the present disclosure relate to electronic packages, and more particularly to electronic packages with computer processor modules that are mounted on opposite sides of a printed circuit board assembly (PCBA).

BACKGROUND

In high performance computing architectures, multiple computer processors may be communicatively coupled together in order to provide enhanced performance. The plurality of computer processors may be coupled to a single printed circuit board assembly (PCBA). The PCBA may be mechanically coupled to a chassis that is inserted into a server rack. In many instances, a plurality of the chassis are inserted into a single server rack, and the computer processors may be communicatively coupled between chassis in order to provide even more enhanced computing power. In some instances the multiple computer processors may be configured to operate as components of a system designed for the implementation of an artificial intelligence device.

Such server rack assemblies face several practical limitations. One such limitation is the overall footprint of the server rack. Data centers and the like are typically expensive in terms of cost per square foot. As such, reducing the footprint of the server rack is one of the design goals of such systems. Additionally, signal latency between computer processors is a major design consideration. Typically, computer processors are fabricated on a single side of the PCBA, and interconnections between computer processors must extend a significant distance to reach an adjacent computer processor. Accordingly, latency can be an issue in some high performance systems.

EMBODIMENTS OF THE PRESENT DISCLOSURE

Described herein are electronic packages with computer processor modules that are mounted on opposite sides of a printed circuit board assembly (PCBA), in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
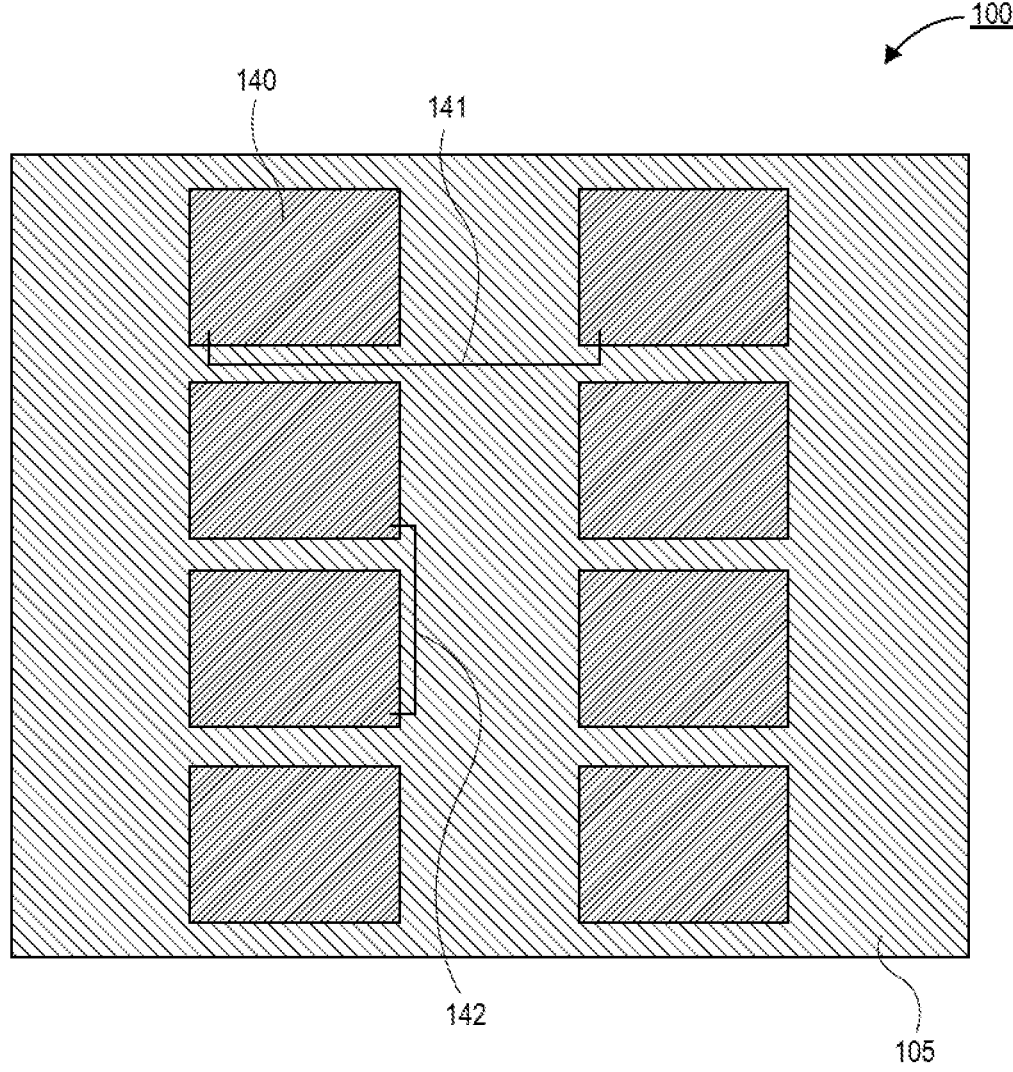
FIG. 1 is a plan view illustration of a computing system that includes a plurality of computer processor modules that are assembled on a single surface of a printed circuit board assembly (PCBA).

As noted above, goals of high performance computing systems may include the desire to reduce the footprint of the system. At the same time, it is desirable to reduce the interconnect length between the computer processor modules. To provide context, FIG. 1 illustrates a typical high performance computing system 100. As shown, a single printed circuit board assembly (PCBA) 105 is provided. A plurality of computer processor modules 140 may be provided on a top surface of the PCBA 105. Package substrates, printed circuit board (PCBs), and the like (not shown) may couple the computer processor modules 140 to the PCBA 105. As used herein a computer processor module 140 refers to any Integrated Circuit (IC) assembly including but not limited to a packaged assembly of any number of IC dies, chips, chiplets, tiles, etc. For example, a computer processor module may include a processor die, such as a microprocessor die, packaged in a manner that permits electrical and mechanical coupling of the processor die to a Printed Circuit Board (PCB) or PCB assembly such that the processor die may be communicatively coupled to one or more other processor dies likewise packaged in one or more additional computer processor modules electrically and mechanically coupled to the PCB or PCB assembly.

As shown, interconnects 141 and 142 may communicatively couple the computer processor modules 140 together. For example, interconnect 141 may couple a first computer processor module 140 in a first column to a second computer processor module 140 in a second column. Interconnect 142 may couple a third computer processor module 140 in a first row to a fourth computer processor module 140 in a second row below the first row. While two interconnects 141 are shown, it is to be appreciated that many interconnects are typically included between the computer processor modules 140. In order to provide the communicative coupling, the interconnects 141 and 142 need to pass horizontally over the PCBA 105. As such, the length of the interconnects 141 and 142 are relatively large. This leads to longer signal latency and diminishes the performance of the computing system.

Additionally, the horizontal layout of the computer processor modules 140 requires a large footprint for the PCBA 105 in order to accommodate each of the computer processor modules 140. In an embodiment, the length of the PCBA 105 (i.e., from top to bottom in FIG. 1) may be approximately 1.0 meter or more. As used herein, "approximately" may refer to a value that is within 10 percent of the stated value. For example, approximately 1.0 may refer to a range between 0.9 and 1.1. The large footprint of the PCBA 105 requires larger chassis and racks in order to house the PCBAs.

Horizontal layouts of the computer processor modules 140 also results in thermal control issues. Assuming air flow from left to right, the computer processor modules 140 in the left column receive the ambient temperature cooling fluid (e.g., air, liquid, etc.) and the computer processor modules 140 in the right column receive cooling fluid that has already been warmed up due to the cooling of the first column. As such, it is more difficult to cool the second column of computer processor modules 140.

Accordingly, embodiments disclosed herein include computer systems that include computer processor modules that are provided in a stacked arrangement. A first computer processor module may be provided on the top of the PCBA, and a second computer processor module may be provided on a bottom of the PCBA directly below the first computer processor module. Such an arrangement may be referred to herein as a "belly-to-belly" arrangement in some instances.

Such an arrangement provides several benefits to the computer system. For one benefit, the belly-to-belly arrangement requires shorter interconnects in order to communicatively couple the first computer processor module to the second computer processor module. As will be described in greater detail below, the signal length using such an arrangement may be approximately 25% of the length of the interconnects described above in FIG. 1. This allows for faster signaling between the computer processor modules and reduces signal latency.

Additionally, such a configuration allows for a decrease in the area of the PCBA. For example, the length of the PCBA may be reduced to be approximately 0.6 meters instead of 1.0 meter. As such, the chassis and rack may be reduced in size. This leads to a smaller overall footprint of the computing system, and can save valuable real estate in a data center or the like. Additionally, the smaller footprint reduces the material costs necessary for the PCBA.

It is to be appreciated that reducing the footprint of the PCBA does have a tradeoff in that the computer system is taller than the embodiment shown in FIG. 1 since computer processor modules are provided on both sides of the PCBA. However, this is not a significant problem. Typically, racks are limited in the amount of power that they can supply. For example, power considerations may limit a typical rack to be able to accommodate up to four PCBAs and associated computer processor modules. In a 42 rack unit (U) rack, this allows each chassis to have a height up to a little more than 10U. In an embodiment, the dual sided PCBAs can comfortably fit in such a form factor. That is, a thickness of the computer systems may be approximately 10U or smaller in some embodiments.

The belly-to-belly architecture also improves cooling efficiency. Since both computer processor modules are provided within the same footprint, the incoming cooling fluid will interface with both the top computer processor module and the bottom computer processor module at the same time. As such, the second computer processor module is not receiving pre-heated cooling fluid, and this allows improved thermal control of the system.

Embodiments disclosed herein may be suitable for any type of high performance computing application. For example, a plurality of PCBAs may be stacked over each other in a rack like system (e.g., a server rack or the like). Communication between computer processor modules on a single PCBA and between different chassis of the rack allow for high performance computing applications. In one such application, the computer processor modules may be communicatively coupled together in order to provide artificial intelligence (AI) processing applications.

Figure 2A:
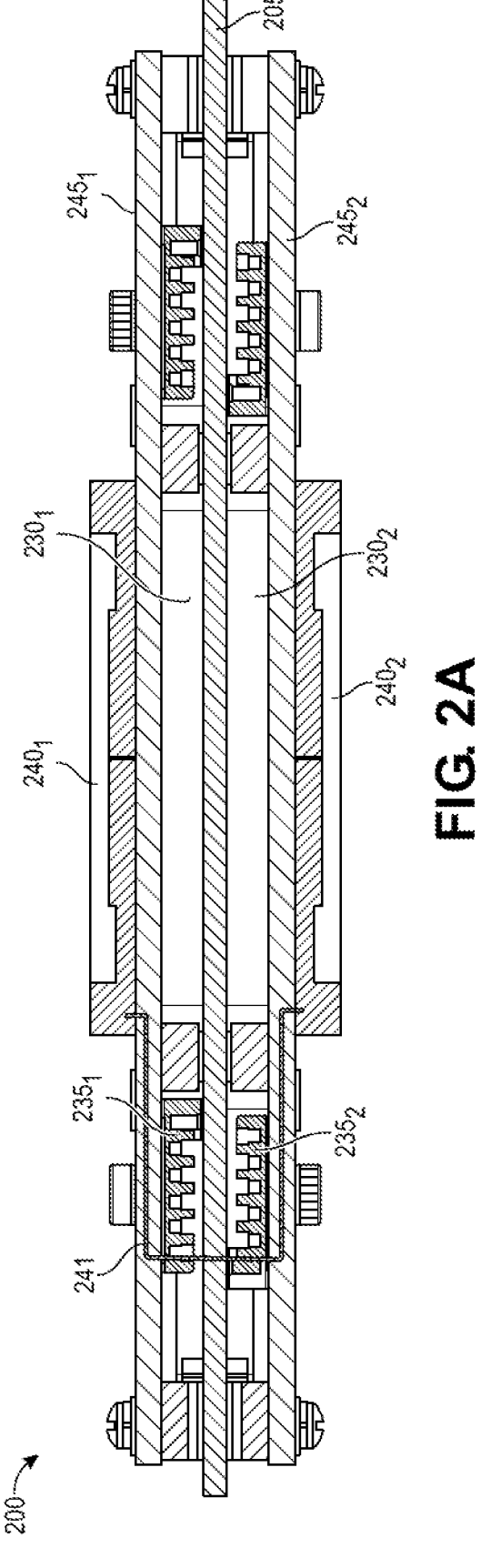
FIG. 2A is a cross-sectional illustration of a computer system that includes computer processor modules that are positioned on opposite surfaces of the PCBA, in accordance with an embodiment.

Referring now to FIG. 2A, a cross-sectional illustration of a computer system 200 is shown, in accordance with an embodiment. In an embodiment, the computer system 200 may comprise a PCBA 205. The PCBA 205 may be one or more organic layers that are laminated over each other. The laminated layers may include reinforcement, such as a glass weave, or the like. In an embodiment, conductive features (not shown) may be provided in and/or on the PCBA 205. For example, conductive features may include pads, traces, vias, and the like. As will be described in greater detail below, the conductive features may be part of an interconnect 241 that couples together computer processor modules 240.

In an embodiment, a stiffener 230 may be provided on the PCBA 205. In the illustrated embodiment, a pair of stiffeners 2301 and 2302 are provided on the PCBA 205. The first stiffener 2301 may be provided on the top surface of the PCBA 205, and the second stiffener 2302 may be provided on the bottom surface of the PCBA 205. The stiffeners 230 may be a stiff material that improves the effective stiffness of the PCBA 205. For example, the stiffeners 230 may include aluminum or other metallic structures.

In an embodiment, a PCB 245 may be provided over the stiffeners 230. For example, a first PCB 2451 is over the top stiffener 2301, and a second PCB 2452 is over the bottom stiffener 2302. In an embodiment, the PCBs 245 may be laminated dielectric layers with conductive routing, not shown. In some embodiments, the PCBs 245 may include lateral interconnect portions of the interconnect 241. The lateral portions of the interconnect 241 may transition vertically at some point. For example, connectors 2351 and 2352 may provide electrical coupling between the PCBs 245 and the PCBA 205. In the illustrated embodiment, the connectors 2351 and 2352 are provided outside a footprint of the computer processor modules 2401 and 2402. However, in other embodiments, the connectors 235 may be provided within a footprint of the computer processor modules 2401 and 2402.

In an embodiment, the computer processor modules 2401 and 2402 may be provided on opposite surfaces of the PCBA 205. The computer processor modules 2401 and 2402 may be any suitable processing devices. In a particular embodiment, the computer processor modules 240 may be processors, graphics processors, memories, and/or the like. The first computer processor module 2401 may be on the top surface of the PCBA 205, and the second computer processor module 2402 may be on the bottom surface of the PCBA 205. The first computer processor module 2401 and the second computer processor module 2402 may be within the same footprint. For example, the first computer processor module 2401 and the second computer processor module 2402 may be in a bell-to-belly configuration. In the illustrated embodiment, the computer processor modules 240 are directly coupled to the PCBs 245. However, in other embodiments, a package substrate, an interposer, or the like may separate the computer processor modules 240 from the PCBs 245.

In an embodiment, the first computer processor module 2401 is communicatively coupled to the second computer processor module 2402 by an interconnect 241. As described above, the interconnect 241 may include conductive features in the PCBs 245, through the connectors 235, and through the PCBA 205. The portion of the interconnect 241 through the PCBs 245 may include a lateral portion (e.g., a trace) and a vertical portion (e.g., a via). The portion of the interconnect 241 through the PCBA 205 may be a vertical via. Though, it is to be appreciated that in some embodiments, lateral routing may also occur in the PCBA 205.

In the illustrated embodiment, the interconnect 241 starts below the computer processor modules 240 and extends laterally out past an edge of the computer processor modules 240. That is, the interconnect 241 may extend outside of a footprint of the computer processor modules 240. However, in other embodiments, the interconnect 241 may be entirely within a footprint of the computer processor modules 240. Despite the lateral portions of the interconnect 241, the overall length of the interconnect 241 is smaller than the lengths of the interconnects 141 and 142 described above. That is, the scale of FIG. 1 and FIG. 2A are different, and results in the length of the interconnect 241 being significantly shorter than the interconnects 141 and 142. For example, the interconnect 241 may be approximately 25% of the length of interconnects 141 and/or 142. As such, the latency of signal passing between the first computer processor module 2401 and the second process module 2402 is significantly reduced.

Figure 2B:
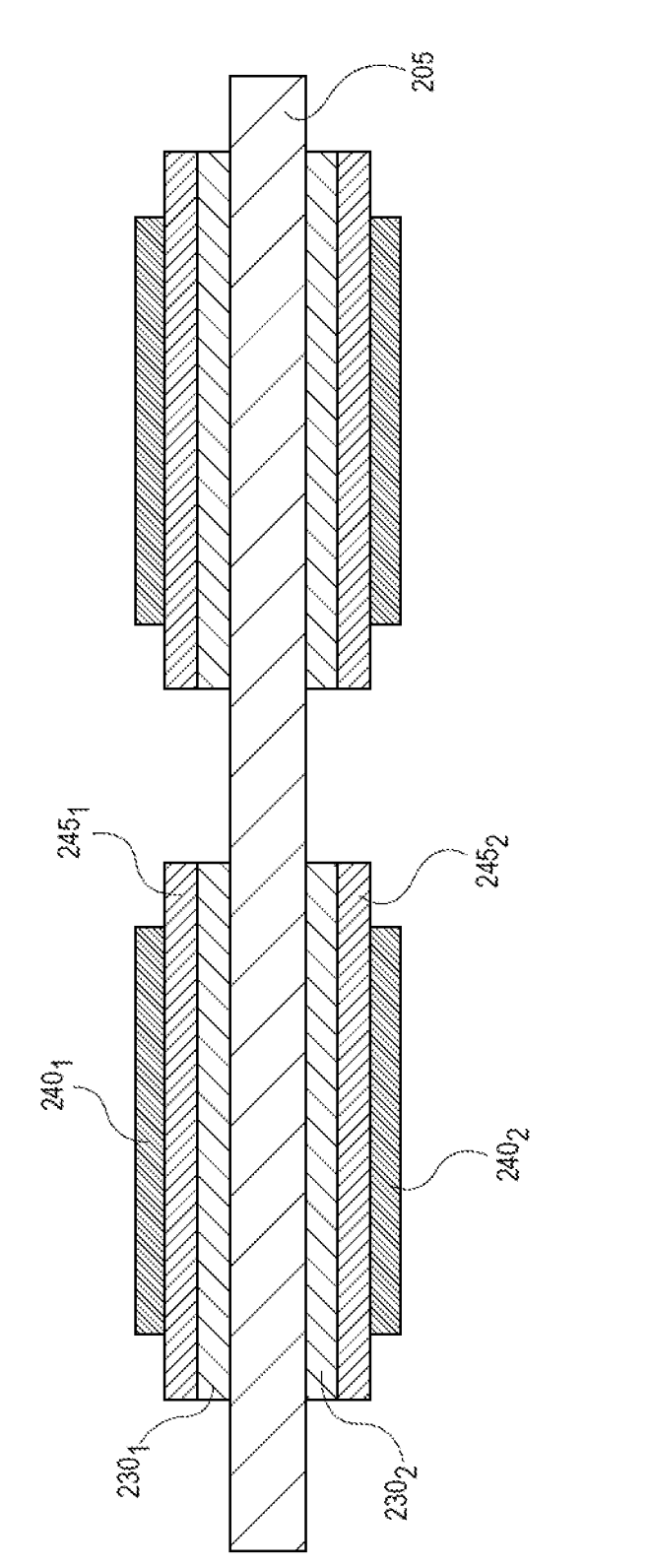
FIG. 2B is a simplified cross-sectional illustration of a computer system with computer processor modules on both sides of the PCBA, in accordance with an embodiment.

Referring now to FIG. 2B, a cross-sectional illustration of a computer system 200 is shown, in accordance with an additional embodiment. In an embodiment, the computer system 200 may be a visually simplified version of the computer system 200 in FIG. 2A. That is, the fine details illustrated in FIG. 2A are omitted in order to simplify the Figure in order to more clearly illustrate certain aspects of the computer system 200. In FIG. 2A, a single stack of the computer processor modules 240 are shown. However, as shown in FIG. 2B, two or more stacks of computer processor modules 240 may be used in some embodiments. For example, two stacks are shown in FIG. 2B.

In an embodiment, the computer system 200 comprises a PCBA 205. In an embodiment, the PCBA 205 may be coupled to PCBs 2451 and 2452 by a pair of stiffeners 2301 and 2302. While shown as solid boxes, it is to be appreciated that signals may pass through the stiffeners 2301 and 2302 using connectors or the like, similar to the embodiment described above with respect to FIG. 2A. The stiffeners 2301 and 2302 may each be coupled to a PCB 2451 and 2452.

In an embodiment, the width of the stiffeners 2301 and 2302 may be substantially similar to widths of the PCBs 2451 and 2452. However, in other embodiments, the width of the stiffeners 2301 and 2302 may be different than the widths of the PCBs 2451 and 2452. In a particular embodiment, the width of the PCBs 2451 and 2452 may be greater than a width of the computer processor modules 2401 and 2402.

Figure 2C:
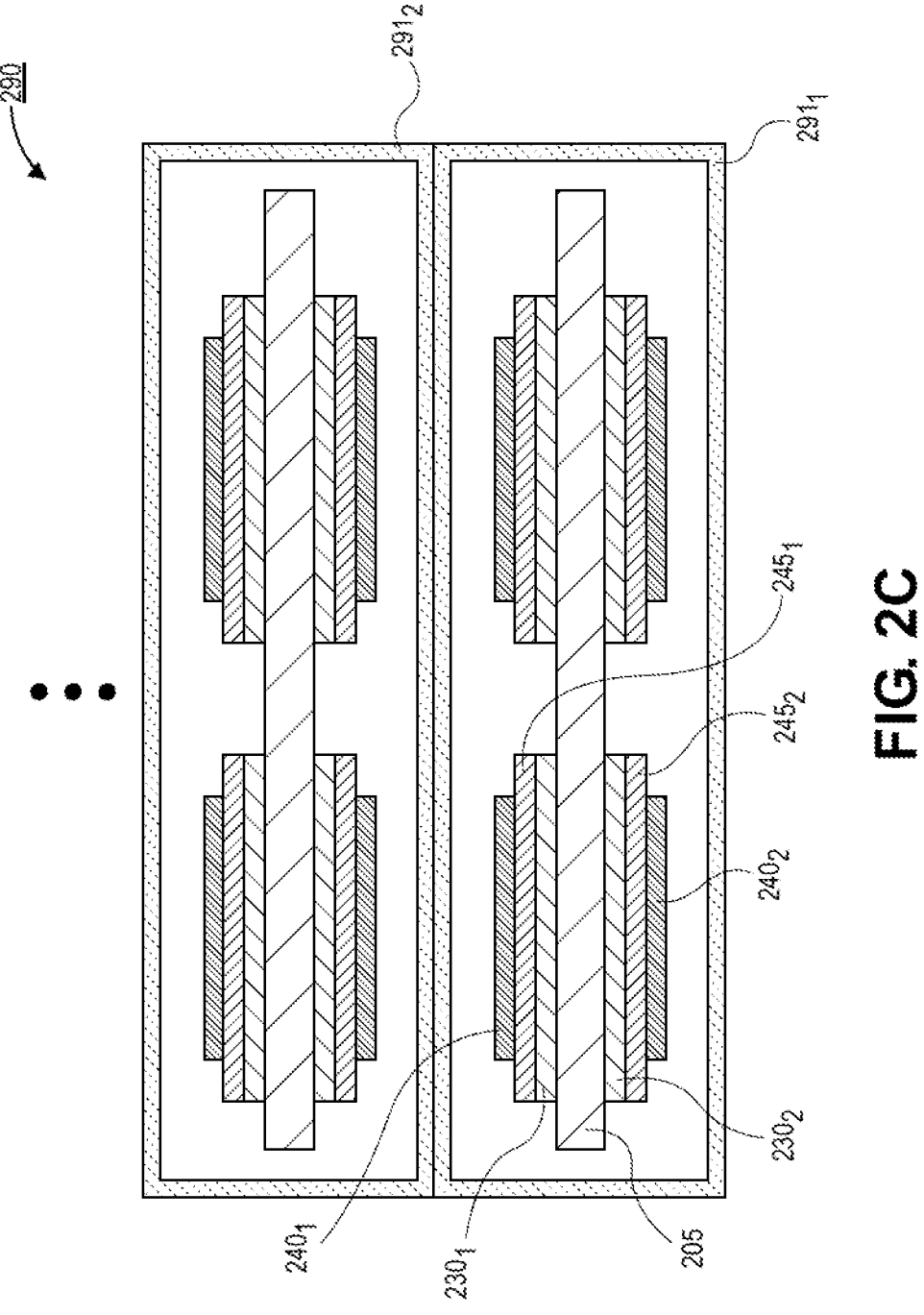
FIG. 2C is a cross-sectional illustration of a plurality of computer systems in different chassis that are coupled together in a rack-type assembly, in accordance with an embodiment.

Referring now to FIG. 2C, a cross-sectional illustration of a rack 290 is shown, in accordance with an embodiment. In an embodiment, the rack 290 may comprise a plurality of chassis 2911 and 2912. The chassis 291 may be stacked over each other within the rack 290. Two chassis 2911 and 2912 are shown, but it is to be appreciated that any number of chassis 291 may be included in the rack 290. For example, in a 42U rack, a set of four chassis 291 that are each approximately 10U tall or thinner may be used.

In an embodiment, each chassis 291 may include a computing system. For example, the computing systems may include a PCBA 205. A belly-to-belly configuration of the computer processor modules 2401 and 2402 may be provided. For example, PCBs 2451 and 2452 and stiffeners 2301 and 2302 may couple the computer processor modules 2401 and 2402 to the PCBA 205. In an embodiment, an interconnect (not shown) may communicatively couple the computer processor module 2401 to the computer processor module 2402.

In the illustrated embodiment, the computing systems are shown as floating within the chassis 291. However, it is to be appreciated that the computing systems may be mechanically coupled to the chassis 291 by screws, bolts, or other mechanical fastening topologies. Additionally, the individual chassis 291 may be coupled to a mechanical rack system (not shown). The rack system may secure the chassis 291 in a vertically stacked arrangement, as shown in FIG. 2C.

In an embodiment, the rack 290 may be used for high performance computing applications. The high performance computing is enabled through the communicative coupling of the computer processor modules 240. The computer processor modules 240 on a single PCBA 205 may be communicatively coupled together, and the chassis 291 may also provide communicative coupling between computer processor modules 240 on different PCBAs 205. In a particular embodiment, the rack 290 is configured to provide high performance computing in order to implement AI computing applications.

Figure 3:
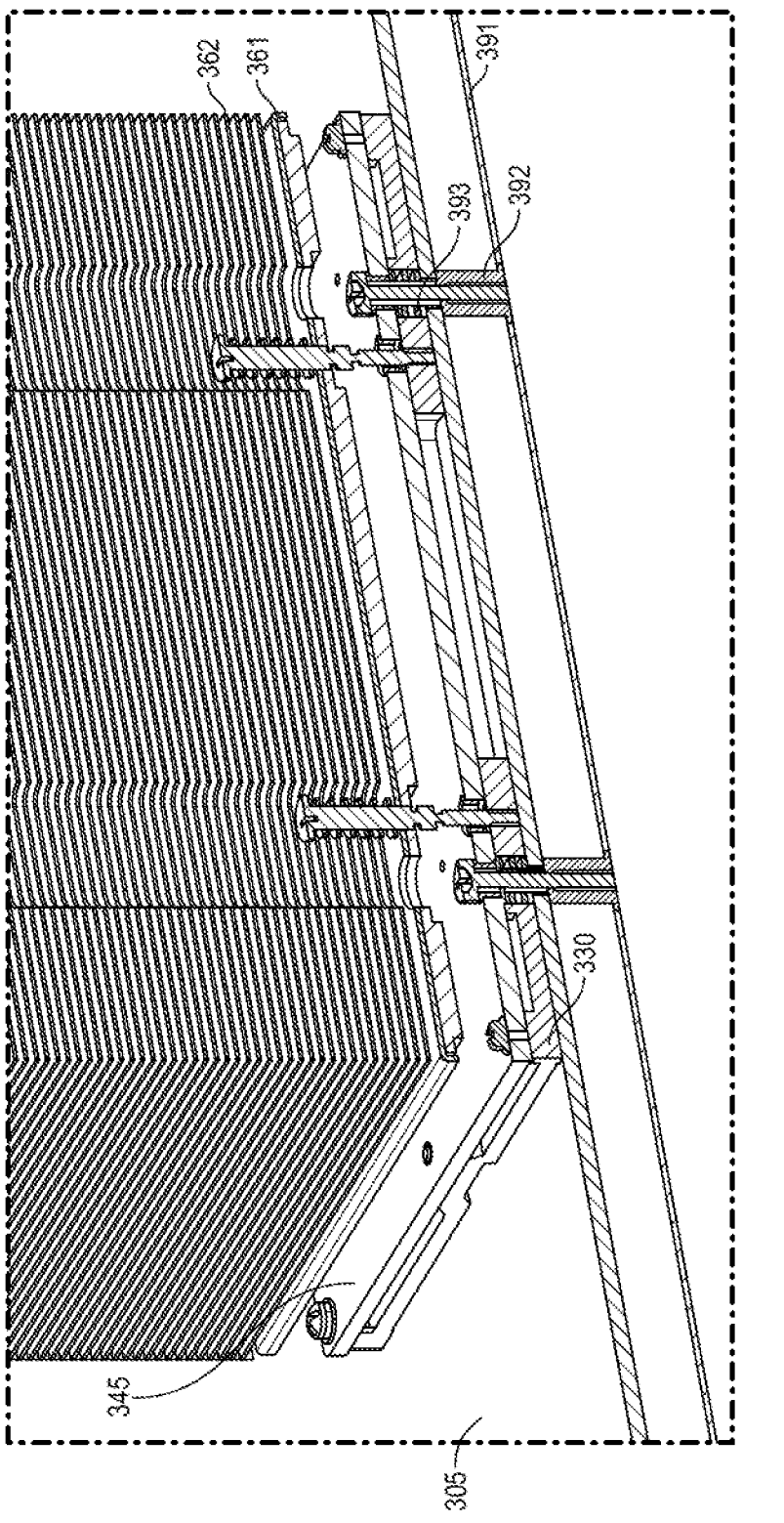
FIG. 3 is a perspective view sectional illustration of a computer system with a computer processor module that is coupled to a chassis with a single stiffener, in accordance with an embodiment.

Referring now to FIG. 3, a perspective view sectional illustration of a computer system 300 is shown, in accordance with an embodiment. In an embodiment, the computer system 300 may include a PCBA 305. In an embodiment, the PCBA 305 may be mechanically coupled to a chassis 391. For example, screws or bolts 393 that pass through a mechanical standoff 392 may be used in some embodiments. In the illustrated embodiment, structures are only shown on the topside of the PCBA 305 for simplicity. However, it is to be appreciated that similar structures may be provided on the bottom side of the PCBA 305 to form a bell-to-belly architecture similar to embodiments described in greater detail above.

In an embodiment, a stiffener 330 may be provided over the PCBA 305. The stiffener 330 may be a stiff material, such as aluminum or other metal structure. The stiffener 330 improves the stiffness of the PCBA 305 in order to provide improved computer system 300 performance. In an embodiment, a PCB 345 may be coupled to the stiffener 330. For example, screws, bolts, or other mechanical coupling architectures may be used to affix the PCB 345 to the stiffener 330.

In an embodiment, a computer processor module is provided over the PCB 345. However, due to the presence of an integrated heat spreader 361 and a thermal solution 362, the computer processor module is not visible in FIG. 3. The computer processor module may have a footprint that is smaller than a footprint of the PCB 345. In an embodiment, the IHS 361 may be thermally coupled to a backside surface of the computer processor module (e.g., with a thermal interface material (TIM) or the like). In an embodiment, the backside surface of the IHS 361 may be thermally coupled to the thermal solution 362 by a second TIM. In the illustrated embodiment, the thermal solution 362 is shown as a plurality of fin like structures. However, it is to be appreciated that any thermal solution (e.g., for air cooling, liquid cooling, etc.) may be used in accordance with embodiments described herein.

Figure 4:
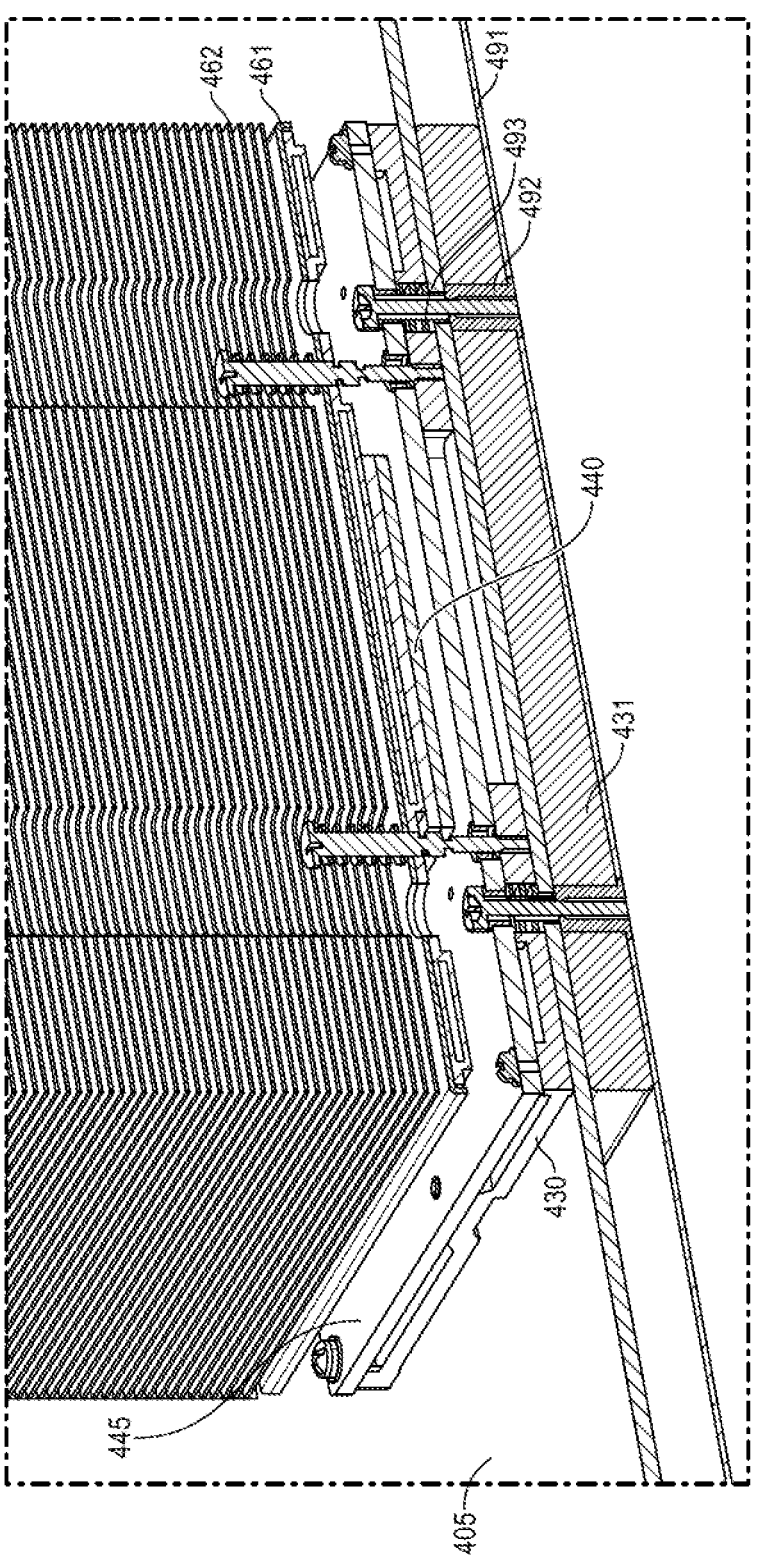
FIG. 4 is a perspective view sectional illustration of a computer system with a computer processor module that is coupled to a chassis with a pair of stiffeners, in accordance with an embodiment.

Referring now to FIG. 4, a perspective view sectional illustration of a computer system 400 is shown, in accordance with an additional embodiment. In an embodiment, the computer system 400 may include a PCBA 405. In an embodiment, a first stiffener 430 may be provided on a top surface of the PCBA 405. Additionally, a second stiffener 431 may be provided on a bottom surface of the PCBA 405. As such, additional stiffness to the PCBA 405 may be provided. The first stiffener 430 and the second stiffener 431 may be coupled to the PCBA 405 through screws or bolts 393 that pass through a mechanical standoff 492. In some instances, the PCBA 405 may further be coupled to a chassis 491.

In an embodiment, a PCB 445 may be provided over the first stiffener 430. The PCB 445 may be electrically coupled to PCBA 405 through connectors (not shown) through the first stiffener 430. The PCB 445 may communicatively couple the PCBA 405 to a computer processor module 440 that is provided over the PCB 445. As shown, an IHS 461 is provided over the backside surface of the computer processor module 440. Additionally, a thermal solution 462 is provided over the backside surface of the IHS 461.

Figure 5:
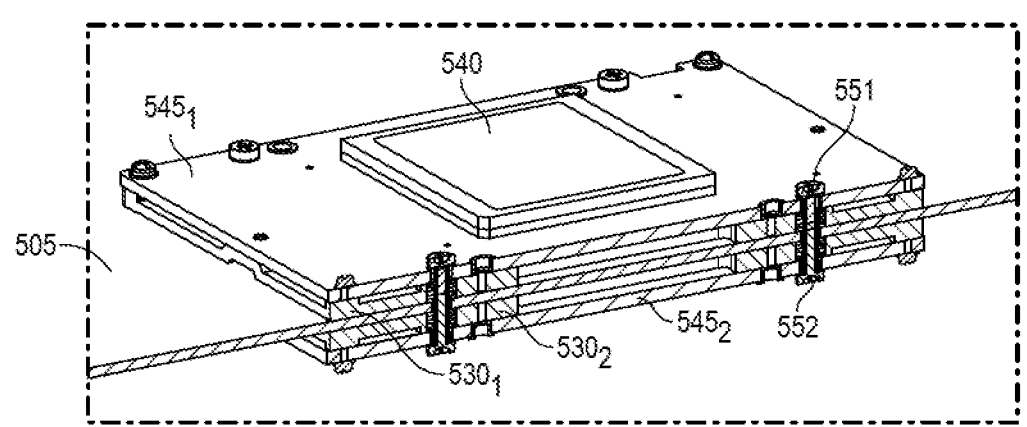
FIG. 5 is a perspective view illustration of a computer system with a pair of computer processor modules that are coupled to a PCBA with a stiffener for each side of the PCBA, in accordance with an embodiment.

Referring now to FIG. 5, a perspective view sectional illustration of a computer system 500 is shown, in accordance with an embodiment. In an embodiment, the computer system 500 may comprise a PCBA 505. In an embodiment, a first stiffener 530$_1$ is provided on the top surface of the PCBA 505, and a second stiffener 530$_2$ is provided on the bottom surface of the PCBA 305. A first PCB 545$_1$ may be provided over the first stiffener 530$_1$, and a second PCB 545$_2$ may be provided over the second stiffener 530$_2$. The first PCB 545$_1$ and the second PCB 545$_2$ may be communicatively coupled to the PCBA 505 through connectors (not shown) through the first stiffener 530$_1$ and the second stiffener 530$_2$.

In an embodiment, the first PCB 545$_1$, the first stiffener 530$_1$, the PCBA 505, the second stiffener 530$_2$, and the second PCB 545$_2$ may be mechanically coupled to each other. For example, screws 551 and 552 may interface with each other to mechanically hold the stack together. In an embodiment, the screw 551 may have external threading, and the screw 552 may have internal threading. The external threading of screw 551 may interface with the internal threading of screw 552 in order to mechanically couple everything together. As shown in FIG. 5, a set of four mechanical couplers are provided, though more or fewer couplers may be used in other embodiments. Additionally, the orientation of the couplers may alternate between locations. For example, two of the couplers have the screw 551 on top, and two of the couplers have the screw 552 on top.

In an embodiment, the computer system 500 may further comprise a pair of computer processor modules 540. However, due to the orientation of FIG. 5, only the top computer processor module 540 is visible. The top computer processor module 540 and the bottom computer processor module (not visible) may share a single footprint. In an embodiment, the computer processor modules 540 may be coupled to the underlying PCBs 545$_1$ or 545$_2$. In an embodiment, the computer processor modules 540 are directly coupled to the PCBs 545. In other embodiments, a package substrate, an interposer, or the like may couple the computer processor modules 540 to the PCBs 545. While not shown for clarity, cooling solutions (e.g., an IHS, and cooling fins) may be provided over the computer processor modules 540.

Figure 6A:
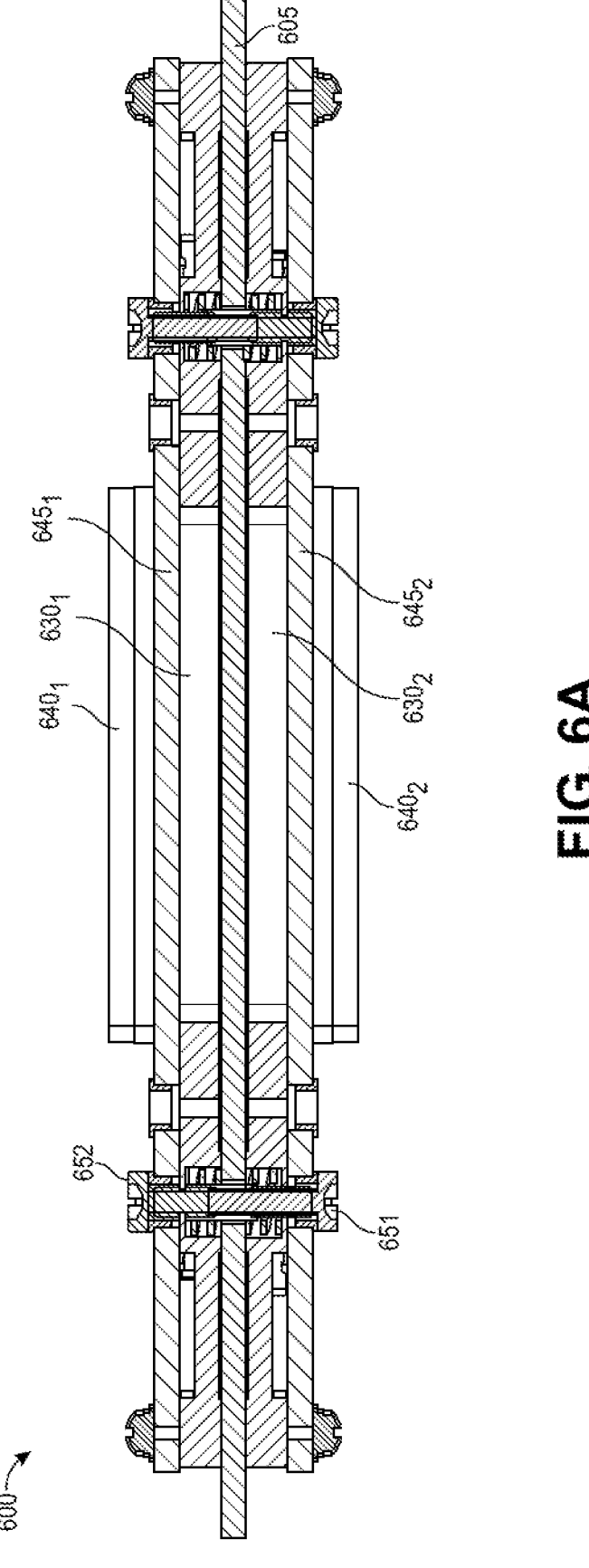
FIG. 6A is a cross-sectional illustration of a computer system that more clearly illustrates the coupling mechanism between the top system and the bottom system, in accordance with an embodiment.

Referring now to FIG. 6A, a cross-sectional illustration of a computer system 600 is shown, in accordance with an additional embodiment. In an embodiment, the computer system 600 may include a PCBA 605. In an embodiment, a first stiffener 630$_1$ is over the PCBA 605, and a second stiffener 630$_2$ is under the PCBA 605. PCBs 645$_1$ and 645$_2$ may be provided over the first stiffener 630$_1$ and under the second stiffener 630$_2$. Additionally, computer processor modules 640$_1$ and 640$_2$ may be provided in the stack of the computer system 600. In an embodiment, the stack of the first PCB 645$_1$, the first stiffener 630$_1$, the PCBA 605, the second stiffener 630$_2$, and the second PCB 645$_2$ may be mechanically coupled together by screws 652 and 651. As shown, screw 652 has a hollow shaft. Internal threading may be provided inside the shaft. Screw 651 may have external threading. The threading of the screw 651 may mate with the threading of screw 652 in order to mechanically couple the stack together.

Figure 6B:
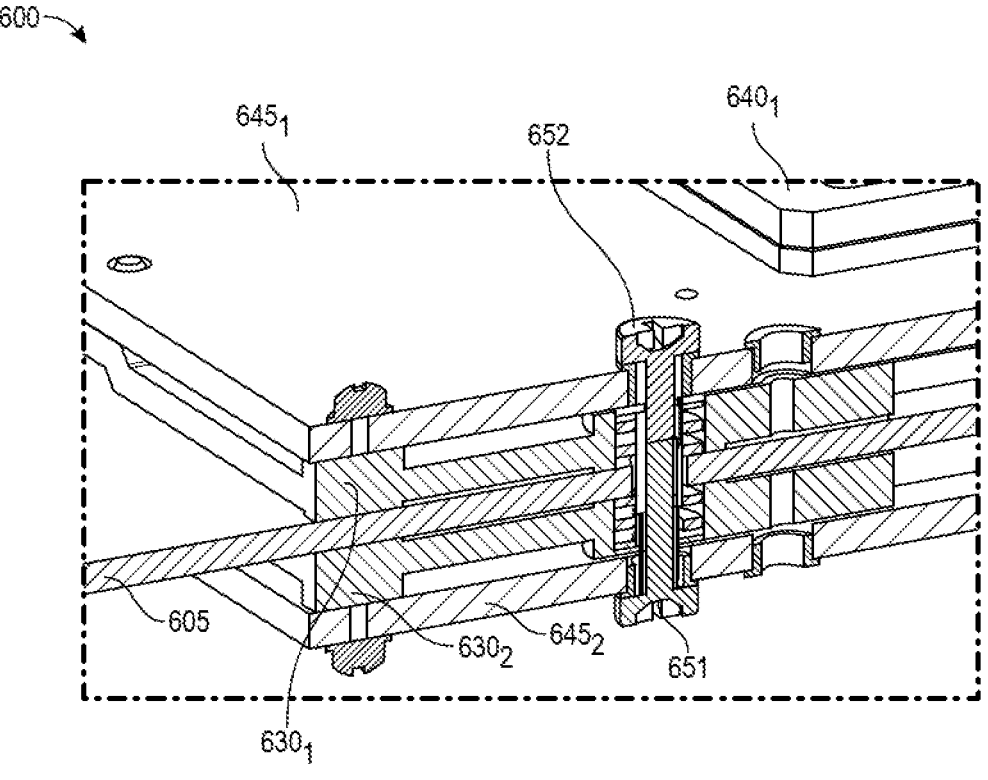
FIG. 6B is a perspective view sectional illustration that more clearly illustrates the coupling mechanism between the top system and the bottom system, in accordance with an embodiment.

Referring now to FIG. 6B, a perspective view sectional illustration of the computer system 600 that more clearly shows the coupling of the screws 651 and 652 is shown, in accordance with an embodiment. As shown, the screw 651 is solid and is inserted into the hollow shaft of the screw 652. While not clearly visible, it is to be appreciated that mating threading between the screws 651 and 652 mechanically holds the stack together.

Figure 7:
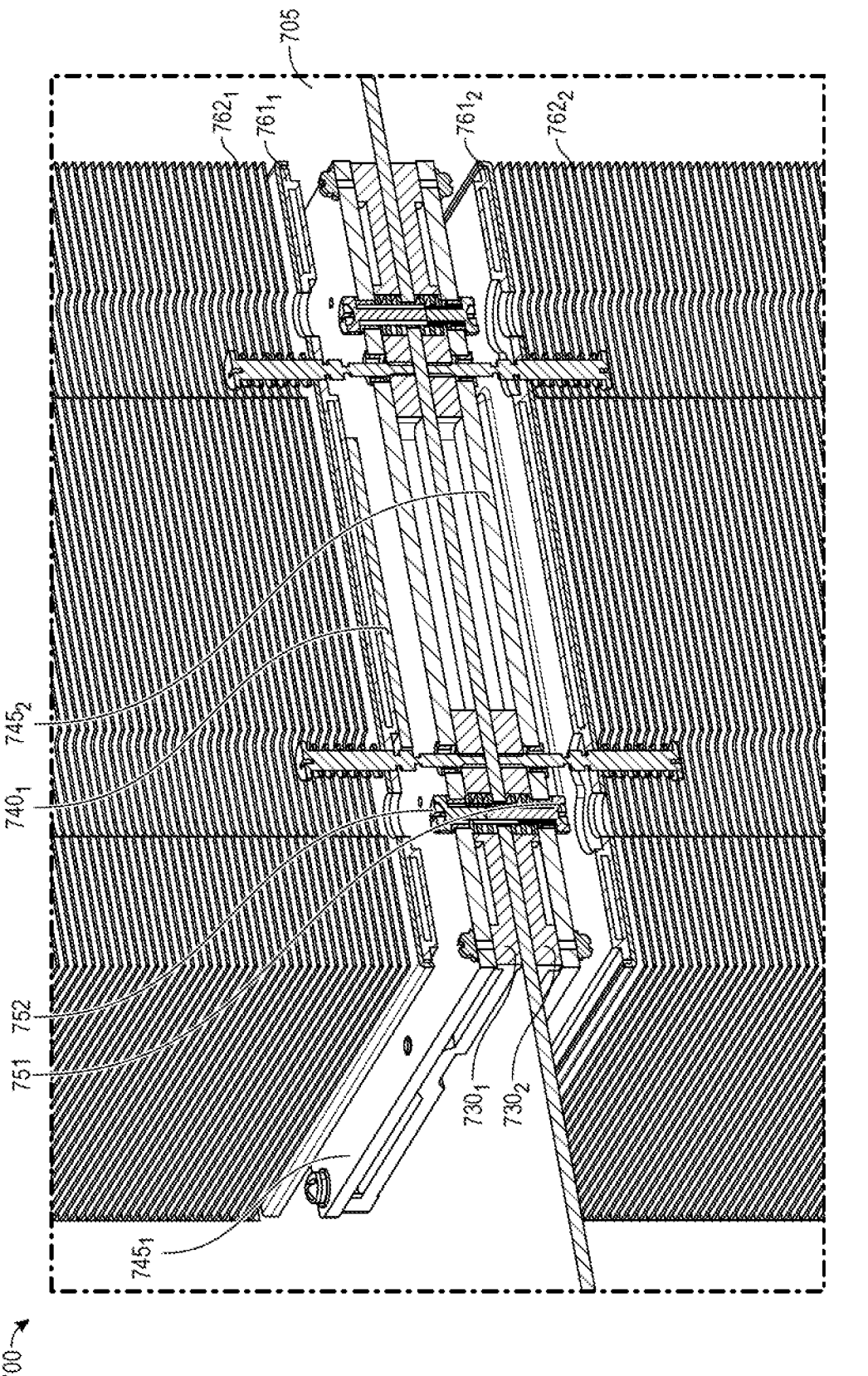
FIG. 7 is a perspective view sectional illustration of a computer system with thermal solutions over the top and bottom system on the PCBA, in accordance with an embodiment.

Referring now to FIG. 7, a perspective view sectional illustration of a computer system 700 is shown, in accordance with an embodiment. In an embodiment, the computer system 700 may include a PCBA 705. In an embodiment, a first stiffener 730$_1$ is over the PCBA 705, and a second stiffener 730$_2$ is under the PCBA 705. PCBs 745$_1$ and 745$_2$ may be provided over the first stiffener 730$_1$ and under the second stiffener 730$_2$. Additionally, computer processor module 740$_1$ may be provided in the stack of the computer system 700. A second computer process model (not visible) is provided below the second PCB 745$_2$. In an embodiment, the stack of the first PCB 745$_1$, the first stiffener 730$_1$, the PCBA 705, the second stiffener 730$_2$, and the second PCB 745$_2$ may be mechanically coupled together by screws 752 and 751. As shown, screw 752 has a hollow shaft. Internal threading may be provided inside the shaft. Screw 751 may have external threading. The threading of the screw 751 may mate with the threading of screw 752 in order to mechanically couple the stack together.

In an embodiment, thermal systems may be provided over the first computer processor module 740$_1$ and under the second computer processor module. The thermal systems may include a pair of IHSs 761$_1$ and 761$_2$, and a pair of thermal solutions 762$_1$ and 762$_2$. While a particular thermal solution is shown in FIG. 7, it is to be appreciated that any thermal solution (e.g., air cooling, liquid cooling, etc.) may be used in different embodiments.

Figure 8:
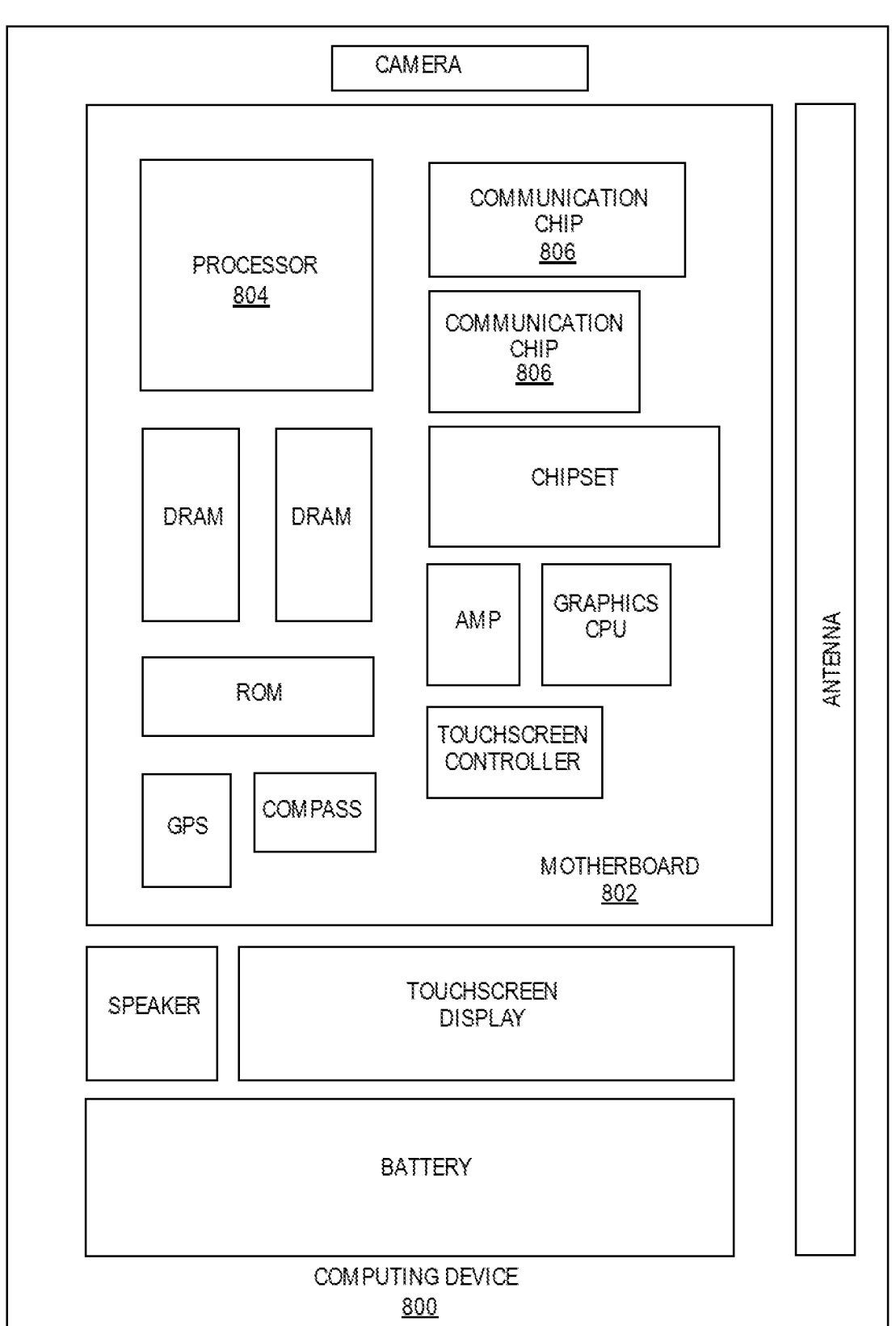
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may part of a computer system that includes a PCBA with belly-to-belly computer processor modules that are coupled to the PCBA through a PCB and through a stiffener, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may part of a computer system that includes a PCBA with belly-to-belly computer processor modules that are coupled to the PCBA through a PCB and through a stiffener, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a computer system, comprising: a printed circuit board assembly (PCBA) with a first surface and a second surface opposite from the first surface; a first computer processor module coupled to the first surface of the PCBA; and a second computer processor module coupled to the second surface of the PCBA, wherein the first computer processor module is communicatively coupled to the second computer processor module through an electrical path that passes through a thickness of the PCBA.

Example 2: the computer system of Example 1, further comprising: a first printed circuit board (PCB) between the first computer processor module and the PCBA; and a second PCB between the second computer processor module and the PCBA.

Example 3: the computer system of Example 2, further comprising: a first stiffener between the first PCB and the PCBA; and a second stiffener between the second PCB and the PCBA.

Example 4: the computer system of Examples 1-3, wherein the electrical path is entirely within a footprint of the first computer processor module.

Example 5: the computer system of Examples 1-4, wherein the electrical path extends out beyond a footprint of the first computer processor module.

Example 6: the computer system of Examples 1-5, wherein the first computer processor module is directly over the second computer processor module.

Example 7: the computer system of Examples 1-6, wherein a length of the PCBA is less than approximately 1.0 meter.

Example 8: the computer system of Example 7, wherein the length of the PCBA is less than approximately 0.6 meters.

Example 9: the computer system of Examples 1-8, further comprising: a first thermal solution over the first computer processor module; and a second thermal solution over the second computer processor module.

Example 10: the computer system of Examples 1-9, wherein the computer system is mounted to a chassis.

Example 11: the computer system of Examples 1-10, wherein the first computer processor module and the second computer processor module are part of an artificial intelligence (AI) computing module.

Example 12: the computer system of Examples 1-11, wherein a thickness of the computer system is approximately 10 rack units (U) or less.

Example 13: a server device, comprising: a server rack; a first chassis in the server rack, wherein the first chassis comprises a first computer system, comprising: a first printed circuit board assembly (PCBA) with a first surface and a second surface opposite from the first surface; a first computer processor module coupled to the first surface of the first PCBA; and a second computer processor module coupled to the second surface of the first PCBA, wherein the first computer processor module is communicatively coupled to the second computer processor module through an electrical path that passes through a thickness of the first PCBA; and a second chassis in the server rack, wherein the second chassis comprises a second computer system comprising: a second PCBA with a third surface and a fourth surface opposite from the third surface; a third computer processor module coupled to the third surface of the second PCBA; and a fourth computer processor module coupled to the fourth surface of the first PCBA, wherein the third computer processor module is communicatively coupled to the fourth computer processor module through an electrical path that passes through a thickness of the second PCBA.

Example 14: the server device of Example 13, wherein the server rack is approximately 42 rack units (U) tall.

Example 15: the server device of Example 13 or Example 14, wherein the first computer system and the second computer system are approximately 10U tall or less.

Example 16: the server device of Examples 13-15, wherein lengths of the first chassis and the second chassis are approximately 1.0 meter or less.

Example 17: the server device of Example 16, wherein the lengths of the first chassis and the second chassis are approximately 0.6 meters or less.

Example 18: the server device of Examples 13-17, wherein the first computer system and the second computer system are part of an artificial intelligence (AI) computing module.

Example 19: the server device of Examples 13-18, further comprising: a stiffener between each of the computer processor modules and their respective PCBA.

Example 20: the server device of Example 19, further comprising: a PCB between each of the computer processor modules and their respective stiffener.

Example 21: the server device of Examples 13-20, further comprising: thermal solutions over each of the computer processor modules.

Example 22: the server device of Examples 13-21, wherein the first computer processor module is directly over the second computer processor module, and wherein the third computer processor module is directly over the fourth computer processor module.

Example 23: a computer system, comprising: a printed circuit board assembly (PCBA) with a first surface and a second surface opposite from the first surface; a first stiffener over the first surface of the PCBA; a first computer processor module coupled to the first stiffener; a second stiffener over the second surface of the PCBA; and a second computer processor module coupled to the second stiffener, wherein the first computer processor module is communicatively coupled to the second computer processor module through an electrical path that passes through a thickness of the PCBA.

Example 24: the computer system of Example 23, wherein electrical connectors pass through the first stiffener and the second stiffener in order to couple the electrical path to the first computer processor module and the second computer processor module.

Example 25: the computer system of Example 23 or Example 24, wherein the first computer processor module and the second computer processor module are part of an artificial intelligence (AI) computing module.

What is claimed is:

1. A computer system, comprising: a printed circuit board assembly (PCBA) with a first surface and a second surface opposite from the first surface; a first computer processor module coupled to the first surface of the PCBA; and a second computer processor module coupled to the second surface of the PCBA, wherein the first computer processor module is communicatively coupled to the second computer processor module through an electrical path that passes through a thickness of the PCBA, and wherein a portion of the electrical path is through a first connector on a first PCB located outside of a footprint of the first computer processor module and through a second connector on second PCB located outside of a footprint of the second computer processor module from a plan view perspective; and a first stiffener, comprising metallic structures, is directly contacted with the first PCB and the PCBA; and a second stiffener, comprising metallic structures, is directly contacted with the second PCB and the PCBA; the first and second computer processor modules are mounted on the first and second PCBs respectively and completely overlap with the first and second stiffeners from a top or bottom view of the PCBA.

2. The computer system of claim 1, wherein the electrical path extends out beyond a footprint of the first computer processor module.

3. The computer system of claim 1, wherein the first computer processor module is directly over the second computer processor module.

4. The computer system of claim 1, wherein a length of the PCBA is less than approximately 1.0 meter.

5. The computer system of claim 4, wherein the length of the PCBA is less than approximately 0.6 meters.

6. The computer system of claim 1, further comprising:
a first thermal solution over the first computer processor module; and
a second thermal solution over the second computer processor module.

7. The computer system of claim 1, wherein the computer system is mounted to a chassis.

8. The computer system of claim 1, wherein the first computer processor module and the second computer processor module are part of an artificial intelligence (AI) computing module.

9. The computer system of claim 1, wherein a thickness of the computer system is approximately 10 rack units (U) or less.

10. A computer system, comprising: a printed circuit board assembly (PCBA) with a first surface and a second surface opposite from the first surface; a first stiffener over the first surface of the PCBA; a first computer processor module coupled to the first stiffener; a second stiffener over the second surface of the PCBA; and a second computer processor module coupled to the second stiffener, wherein the first computer processor module is communicatively coupled to the second computer processor module through an electrical path that passes through a thickness of the PCBA, and wherein a portion of the electrical path is through a first connector on a first PCB located outside of a footprint of the first computer processor module and through a second connector on second PCB located outside of a footprint of the second computer processor module from a plan view perspective; and the first stiffener, comprising metallic structures, is directly contacted with the first PCB and the PCBA; and the second stiffener, comprising metallic structures, is directly contacted with the second PCB and the PCBA; the first and second computer processor modules are mounted on the first and second PCBs respectively and completely overlap with the first and second stiffeners from a top or bottom view of the PCBA.

11. The computer system of claim 10, wherein electrical connectors pass through the first stiffener and the second stiffener in order to couple the electrical path to the first computer processor module and the second computer processor module.

12. The computer system of claim 10, wherein the first computer processor module and the second computer processor module are part of an artificial intelligence (AI) computing module.

* * * * *